(12) United States Patent
Matsubara et al.

(10) Patent No.: US 6,501,118 B2
(45) Date of Patent: Dec. 31, 2002

(54) SEMICONDUCTOR DEVICE HAVING CONDUCTING MATERIAL FILM FORMED IN TRENCH, MANUFACTURING METHOD THEREOF AND METHOD OF FORMING RESIST PATTERN USED THEREIN

(75) Inventors: Hiroshi Matsubara, Hyogo (JP); Syuji Nakao, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/819,988

(22) Filed: Mar. 29, 2001

(65) Prior Publication Data

US 2001/0010378 A1 Aug. 2, 2001

Related U.S. Application Data

(62) Division of application No. 09/292,371, filed on Apr. 15, 1999, now Pat. No. 6,306,699.

(30) Foreign Application Priority Data

Aug. 11, 1998 (JP) .......................................... 10-226790

(51) Int. Cl.⁷ ............................................... H01L 29/02
(52) U.S. Cl. ...................... 257/303; 257/296; 257/300; 257/301; 257/306; 257/379
(58) Field of Search ................................. 257/303, 301, 257/300, 306, 379, 296

(56) References Cited

U.S. PATENT DOCUMENTS

| | | | | |
|---|---|---|---|---|
| 5,498,889 A | * | 3/1996 | Hayden | 257/301 |
| 5,847,423 A | | 12/1998 | Yamamichi | |
| 6,156,640 A | * | 12/2000 | Tsai et al. | 257/302 |

FOREIGN PATENT DOCUMENTS

| | | |
|---|---|---|
| JP | 1-194424 | 8/1989 |
| JP | 2-177355 | 7/1990 |
| JP | 3-41764 | 2/1991 |

* cited by examiner

Primary Examiner—Edward Wojciechowicz
(74) Attorney, Agent, or Firm—McDermott, Will & Emery

(57) ABSTRACT

A highly reliable semiconductor device having an underlying film with a trench and a conducting material film formed in the trench, a method of manufacturing the same and a method of forming a resist pattern used therein are obtained. The underlying film having an upper surface and the trench is formed. The conducting material film is formed on the upper surface and in the trench. A photo resist film is formed on the conducting material film located on the upper surface of the underlying film and in the trench. The photo resist film is left in the trench whereas the photo resist film is developed and removed outside the trench. The conducting material film located on the upper surface of the underlying film is etched and removed with the photo resist film left in the trench used as a mask.

1 Claim, 11 Drawing Sheets

SEMICONDUCTOR DEVICE HAVING CONDUCTING MATERIAL FILM FORMED IN TRENCH, MANUFACTURING METHOD THEREOF AND METHOD OF FORMING RESIST PATTERN USED THEREIN

This application is a Divisional of application Ser. No. 09/292,371 filed Apr. 15, 1999 now U.S. Pat. No. 6,306,694.

BACKGROUND OF THE INVENTION

1. Field of the Invention

The present invention relates to a semiconductor device, a manufacturing method thereof and a method of forming a resist pattern used therein. More particularly, the present invention relates to a semiconductor device having a conducting material film formed in a trench, a manufacturing method thereof and a method of forming a resist pattern used therein.

2. Description of the Background Art

In the field of a DRAM (Dynamic Random Access Memory), which is conventionally known as one type of the semiconductor device, efforts have been made to increase capacity and miniaturize the device. Along with these efforts and achievements, to secure a capacity necessary for a capacitor cell, which is an element of a DRAM, within a limited area of a semiconductor substrate, three-dimensional cells such as a trench type cell or a stacked type cell have been developed. Among the stacked capacitor cells, those with vertically long shape such as a cylindrical type cell or a thick film type cell are mainly used.

FIGS. 17–19 show partial sectional views of a cylindrical stacked capacitor cell, on which the present invention is based and which is referenced for describing the manufacturing process of a lower electrode of a capacitor. With reference to FIGS. 17–19, the manufacturing process of the capacitor lower electrode of the cylindrical stacked capacitor cell will be described.

As shown in FIG. 17, a first interlayer insulation film 115 is formed on a semiconductor substrate (not shown). Openings 116a and 116b are formed in first interlayer insulation film 115. Plugs 117a and 117b are formed respectively in openings 116a and 116b for electrically connecting the capacitor lower electrode and a conducting region in a main surface of the semiconductor substrate. A second interlayer insulation film 123 is formed on first interlayer insulation film 115. Trenches 130a and 130b are formed in second interlayer insulation film 123 in regions above plugs 117a and 117b. Polycrystalline silicon film 119 is formed on second interlayer insulation film 123 as well as in trenches 130a and 130b. An HSG (Hemi Spherical Grained) polycrystalline silicon film 120 having a resist 127 formed thereon is formed on polycrystalline silicon film 119. Here, HSG polysilicon film means a polysilicon film having roughened surface, and to roughen (roughening) refers to a process of generating hemispherical grains by growing crystal grains.

With etch back of resist 127 using Reactive Ion Etching (hereinafter referred to as RIE), portions 127a and 127b of resist are left in trenches 130a and 130b as shown in FIG. 18 while resist 127 (see FIG. 17) is removed in other regions. Here, the level difference L1 between an upper surface of HSG polycrystalline silicon film 120 on second interlayer insulation film 123 and an upper surfaces of resists 127a and 127b is called recess length. As will be described hereinafter, as portions 127a and 127b of resist are used as masks for removing polycrystalline silicon film 119 and HSG polycrystalline silicon film 120 on second interlayer insulation film 123, the recess length L1 must be controlled with a high precision. If the recess length L1 is too small and the upper surfaces of resist portions 127a and 127b are higher than the upper surface of second interlayer insulation film 123, problems arise. For example, upon etching for removing polycrystalline silicon film 119 and HSG polycrystalline silicon film 120 on the upper surface of second interlayer insulation film 123, etching residue may be produced.

Then using resist portions 127a and 127b as masks, polycrystalline silicon film 119 and HSG polycrystalline silicon film 120 on the upper surface of second interlayer insulation film 123 are etched and removed. Thus a capacitor lower electrode of polycrystalline silicon film 119a and HSG polycrystalline silicon film 120a is formed in trench 130a and a capacitor lower electrode of polycrystalline silicon film 119b and HSG polycrystalline silicon film 120b is formed in trench 130b as shown in FIG. 19.

Then resist portions 127a and 127b are removed and a dielectric film, a capacitor upper electrode and so on are formed on the capacitor lower electrode. The cylindrical stacked capacitor cell is thus formed.

The process shown in FIGS. 17–19 has a following problem. When the resist is etched back by RIE to leave resist portions 127a and 127b only in trenches 130a and 130b as shown in FIG. 18, an oxide film or the like is sometimes partially formed on the surface of HSG polycrystalline silicon film 120 on the upper surface of second interlayer insulation film 123. The oxide film thus formed through RIE serves as a mask upon etching of polycrystalline silicon film 119 and HSG polycrystalline silicon film 120 for isolating the capacitor lower electrode trench by trench. Therefore polycrystalline silicon film 119 of HSG polycrystalline silicon film 120 is sometimes partially left on the upper surface of second interlayer insulation film 123.

When polycrystalline silicon film 119 or the like is left on the upper surface of second interlayer insulation film 123, the capacitor lower electrode is not sufficiently isolated, and whereby a problem such as short circuit of the capacitor lower electrode is caused. As a result, operation failure and reliability degradation of the DRAM occur.

Alternatively, CMP (Chemical Mechanical Polishing) can be used for removing resist 127 (see FIG. 17) in the region outside trenches 130a and 130b for leaving resist portions 127a and 127b in trenches 130a and 130b. In this case, however, slurry used in CMP is left in the area such as an inner area of trenches 130a and 130b, and adversely affects the subsequent process steps. The slurry thus left in trenches 130a and 130b also causes operation failure and reliability degradation of the semiconductor device such as a DRAM.

SUMMARY OF THE INVENTION

An object of the present invention is to provide a highly reliable semiconductor device having a conducting material film formed in a trench.

Another object of the present invention is to provide a method of manufacturing a highly reliable semiconductor device having a conducting material film formed in a trench.

Still another object of the present invention is to provide a method of forming a resist pattern which can be used in the method of manufacturing the highly reliable semiconductor device having the conducting material film formed in the trench.

In the method of manufacturing the semiconductor device according to one aspect of the present invention, an underlying film having an upper surface and a trench is formed. A conducting material film is formed on the upper surface and in the trench. A photo resist film is formed on the conducting material film which is located on the upper surface of the underlying film and in the trench. The photo resist film is left in the trench whereas in other region the photo resist film is developed and removed. With the photo resist film left in the trench used as a mask, the conducting material film on the upper surface of the underlying film is etched and removed.

Thus, an etching technique such as RIE which is used in a conventional manufacturing process is not employed in the step of leaving the photo resist film in the trench and removing the photo resist film in the region outside the trench. Therefore the formation of oxide film on the conducting material film caused by etching can be prevented. As a result, in the step of removing the conducting material film on the upper surface of the underlying film, the conducting material film is prevented from being partially left on the upper surface of the underlying film because of the existence of the oxide film. Thus, failure such as short circuit caused by the residual conducting material film can be avoided, whereby a highly reliable semiconductor device can be obtained.

In addition, as the development is utilized in the step of leaving the photo resist film in the trench, the thickness of the photo resist film to be removed and therefore the level of the upper surface of the photo resist film left in the trench can be controlled with high precision by controlling the time of development.

In the method of manufacturing the semiconductor device in accordance with one aspect of the present invention, the photo resist film in the region outside the trench may be exposed before the development.

Then the thickness of the exposed photo resist film, which is to be removed in the step of removing the photoresist film outside the trench, can be controlled by the control of exposure energy when a positive photo resist film is used. Therefore, the level of the upper surface of the photo resist film left in the trench can be controlled more surely.

In the method of manufacturing the semiconductor device in accordance with one aspect of the present invention, the photo resist film in the region outside the trench may be completely exposed whereas the photo resist film to be left in the trench may not be exposed in the step of exposing the photo resist film.

As the photo resist film in the trench is not exposed when the positive photo resist film is used, the photo resist film can surely be left in the trench after the development.

In the method of manufacturing the semiconductor device in accordance with one aspect of the present invention, light used for the exposure may be directed obliquely for irradiation to the upper surface of the underlying film in the step of exposing the photo resist film.

Thus the light is prevented from reaching the bottom portion of the trench, because the light for exposure is not in a direction perpendicular to the extension of the upper surface of the underlying film. Therefore the exposure of the photo resist film at the bottom portion of the trench can surely be prevented. As a result, the photo resist film can surely be left in the trench.

In the method of manufacturing the semiconductor device in accordance with one aspect of the present invention, an angle of incidence of the light used for exposure with respect to the upper surface of the underlying film may be adjusted so that the light does not reach the photo resist film to be left in the trench in the step of exposing the photo resist film.

Thus the exposure of the photo resist film to be left in the trench can even more surely be prevented and the photo resist film can surely be left in the trench. In addition, the location in the trench where the light reaches can be adjusted by adjusting the angle of incidence of the light used for exposure with respect to the upper surface of the underlying film. As a result, the level of the upper surface of the photo resist film left in the trench can be controlled with high precision.

In the method of manufacturing the semiconductor device in accordance with one aspect of the present invention, the step of forming the underlying film may include the steps of: forming an underlying film with a planar upper surface; forming a resist pattern for forming a trench on the upper surface using a photo resist film for pattern formation; and forming the trench by removing the underlying film using the resist pattern as a mask. The photo resist film may be less sensitive to the light than the photo resist film for pattern formation.

Thus, even when the exposure energy upon photo resist film exposure varies, the fluctuation of the thickness of the exposed portion of the photo resist film can be made smaller than when the photo resist film for pattern formation is used. As a result, the fluctuation of the level of the upper surface of the photo resist film left in the trench can be made smaller than in a conventional art.

In the method of manufacturing the semiconductor device in accordance with one aspect of the present invention, the step of forming the photo resist film may include a step of forming the photo resist film such that the non-exposed portion with the thickness of the photo resist film to be left in the trench is left even when the exposure energy is increased in the step of exposing the photo resist film.

Thus the delicate control of the exposure energy in the step of exposing the photo resist film is not necessary for adjusting the thickness of the exposed portion of the photo resist film and for leaving the non-exposed portion of the photo resist film with the necessary thickness in the trench. Therefore, even when the exposure energy varies, and even if the light with the exposure energy above a predetermined value is directed to the photo resist film, the non-exposed portion with a predetermined thickness can be formed and whereby the photo resist film with the predetermined thickness can surely be left in the trench.

In addition, as the thickness of the exposed portion can be determined by the chemical composition of the photo resist film, the thickness of the non-exposed portion of the photo resist film can be controlled with higher precision than when the thickness of the exposed portion is controlled by adjusting the exposure energy. As a result, more precise control of the level of the upper surface of the photo resist film left in the trench is allowed.

The method of manufacturing the semiconductor device in accordance with one aspect of the present invention may further include the step of forming under the photo resist film, a light absorption film absorbing the light used in the step of exposing the photo resist film.

Thus the light is prevented from reaching inside the underlying film, because of the existence of the light absorption film. Therefore, the exposure of the side surface and so on of the photo resist film in the trench, caused by the entrance and scattering of the light used in the step of exposing the photo resist film, in the underlying film under the photo resist film, can be prevented. As a result, the photo resist film can surely be left in the trench.

In the method of manufacturing the semiconductor device in accordance with another aspect of the present invention, an underlying film having an upper surface and a trench is formed. A conducting material film is formed on the upper surface and in the trench. A photo resist film having an upper surface is formed on the conducting material film in the trench. The level of the upper surface of the photo resist film is made lower than the level of the upper surface of the underlying film through curing of the photo resist film. The conducting material film on the upper surface of the underlying film is etched and removed with the use of cured photo resist film as a mask.

Here, the curing is a treatment for hardening and shrinking the photo resist film by directing an ultra violet ray (Deep UV) or conducting a heat treatment on the photo resist film. At curing time longer than a predetermined period, volumetric shrinkage of the photo resist film shows a certain threshold value.

Because of this certain threshold value of volumetric shrinkage of the photo resist film at the curing time longer than a predetermined amount, with the adjustment of the thickness of the photo resist film prior to the curing, the height of the upper surface of the photo resist film after the curing can be correctly controlled.

In addition, the formation of the oxide film on the conducting material film can be prevented because technique such as RIE is not employed in the step of forming the upper surface of the photo resist film at a level lower than the upper surface of the underlying film. Thus in the step of removing the conducting material film located on the upper surface of the underlying film, a portion of the conducting material film is prevented from being left on the upper surface of the underlying film, which is caused by the existence of the oxide film. As a result, failure such as a short circuit which is attributable to the residual conducting material film can be prevented, and whereby a highly reliable semiconductor device can be obtained.

In a method of forming a resist pattern in accordance with still another aspect of the present invention, the resist pattern is formed on an underlying film having an upper surface and a lower upper surface lower than the upper surface and adjacent to the upper surface with a step side wall therebetween. In this method, a photo resist film is formed on the upper surface, the step side wall, and the lower upper surface. The photo resist film formed in a region other than the bottom portion of the step side wall is exposed by the light incident obliquely on the upper surface. A non-exposed portion of the photo resist film is left at the bottom portion of the step side wall and the exposed portion of the photo resist film is removed by development.

With the use of the light directed obliquely to the upper surface for the exposure of the photo resist film, the exposure of the photo resist film at the bottom portion of the step side wall can surely be prevented. Thus, the non-exposed portion of the photo resist film can surely be left at the bottom portion of the step side wall.

In addition, the amount of the photo resist film left at the bottom portion of the step side wall can be controlled through the adjustment of the angle of incidence of the light used for exposure with respect to the upper surface.

A semiconductor device in accordance with still another aspect of the present invention includes an underlying film having a trench, a conducting material film formed in the trench, and, a light absorption film formed on the conducting material film, for absorbing the light used in photolithography for forming the conducting material film.

Thus, in the step of forming the conducting material film in the trench, as the light used in the exposure/development is absorbed by the light absorption film, even when the photo resist film is formed in the trench and on the underlying film outside the trench, and the photo resist film outside the trench is removed by the exposure/development, the light is prevented from reaching the underlying film and the conducting material film. Therefore, the light is not scattered in the underlying film and the conducting material film, and the exposure of the side surface and the bottom surface of the photo resist film in the trench can be prevented. As a result, the photo resist film can surely be left in the trench. Thus the failure caused by the partial absence of the photo resist film in the trench, such as the removal of the conducting material film which is to be left in the trench can be prevented in the step of forming the conducting material film in the trench.

In the semiconductor device in accordance with the still another aspect of the present invention, the conducting material film may be a capacitor lower electrode, and the device may further include a dielectric film formed on the capacitor lower electrode and a capacitor upper electrode formed on the dielectric film.

In the semiconductor device in accordance with the still another aspect of the present invention, the light absorption film may be a silicon nitrided oxide film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The preferred embodiments of the present invention will be described with reference to the drawings.

First Example

Figure 1:
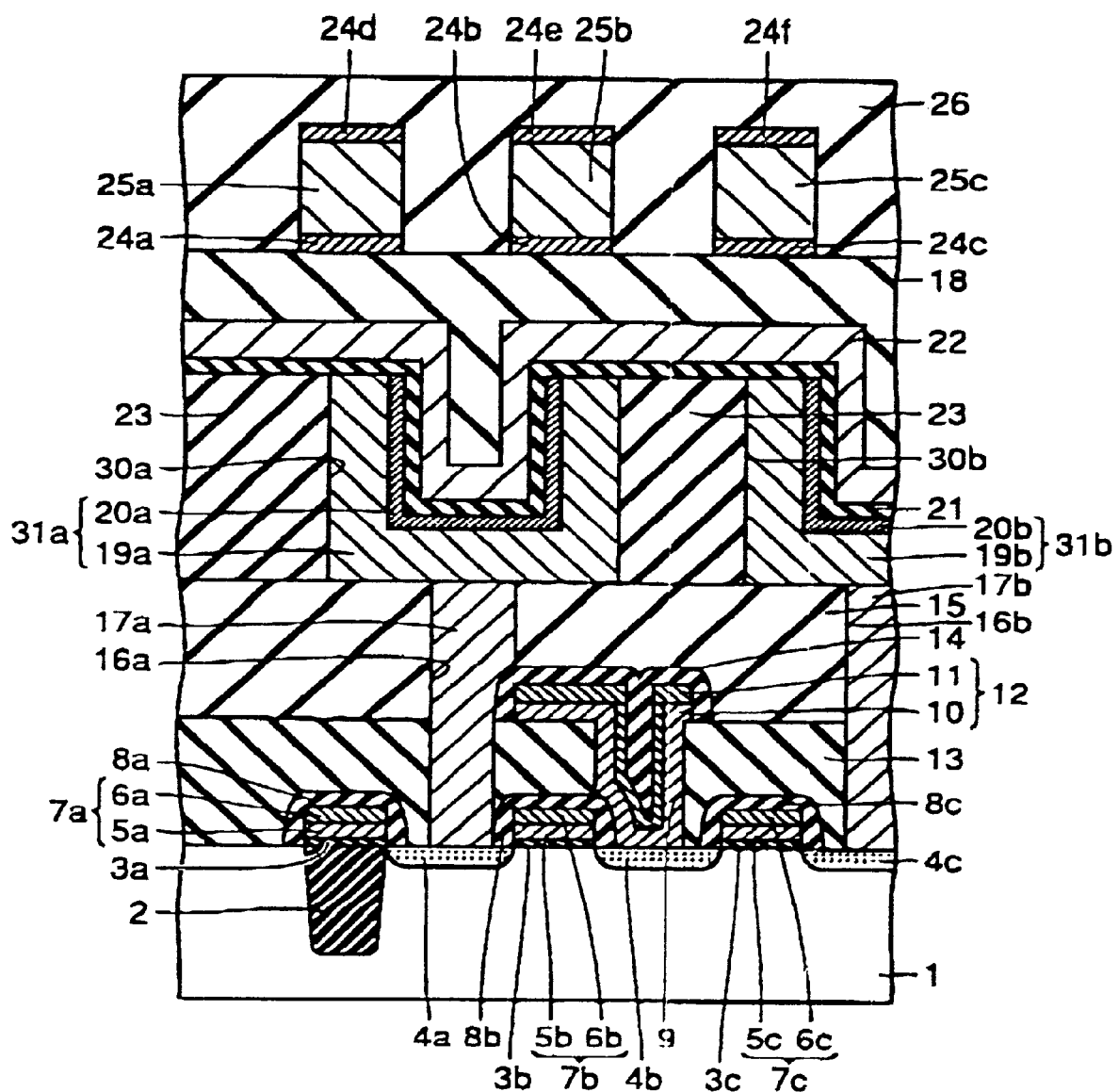
FIG. 1 is a sectional view showing a first example of the semiconductor device in accordance with the present invention.

With reference to FIG. 1, a semiconductor device includes a field effect transistor and a capacitor formed on a semiconductor substrate 1. In a main surface of semiconductor substrate 1, a trench isolation oxide film 2 is formed. Gate insulation films 3a–3c are formed on the main surface of semiconductor substrate 1 in an active region isolated by trench isolation oxide film 2 and on trench isolation oxide film 2. Polycrystalline silicon films 5a–5c are formed on gate insulation films 3a–3c. Refractory metal silicide films 6a–6c are formed on polycrystalline silicon film 5a–5c. Gate electrodes 7a–7c are formed of polycrystalline silicon films 5a–5ac and refractory metal silicide films 6a–6c. Source/drain regions 4a–4c of the field effect transistor are formed in the main surface of semiconductor substrate 1 in the region between gate electrodes 7a–7c. Insulation films 8a–8c are formed on gate electrodes 7a–7c and gate insulation films 3a–3c. A first interlayer insulation film 13 is formed on insulation films 8a–8c.

An opening 9 is formed in first interlayer insulation film 13 in the region above source/drain region 4b. A polycrystalline silicon film 10 is formed on an upper surface of first interlayer insulation film 13 and in opening 9. A refractory metal silicide film 11 is formed on polycrystalline silicon film 10. An interconnection 12 includes polycrystalline silicon film 10 and refractory metal silicide film 11. An insulation film 14 is formed on interconnection 12. A second interlayer insulation film 15 is formed on first interlayer insulation film 13 and insulation film 14.

In the region above source/drain regions 4a and 4c in the main surface of semiconductor substrate 1, openings 16a and 16b are formed with a part of first and second interlayer insulation films 13 and 15 removed. Plugs 17a and 17b of a conducting material are formed in openings 16a and 16b.

A third interlayer insulation film 23 is formed on second interlayer insulation film 15. Third interlayer insulation film 23 includes trenches 30a and 30b in regions above plugs 17a and 17b. Polycrystalline silicon films 19a and 19b are formed in trenches 30a and 30b. HSG polycrystalline silicon films 20a and 20b are formed on polycrystalline silicon films 19a and 19b. Capacitor lower electrodes 31a and 31b include polycrystalline silicon films 19a and 19b and HSG polycrystalline silicon films 20a and 20b. A dielectric film 21 is formed on HSG polycrystalline silicon films 20a and 20b and on the upper surface of third interlayer insulation film 23. A capacitor upper electrode 22 is formed on dielectric film 21. A fourth interlayer insulation film 18 is formed on upper electrode 22.

TiN films 24a–24c are formed at a predetermined interval on the upper surface of fourth interlayer insulation film 18. Aluminum interconnections 25a–25c are formed on TiN films 24a–24c. TiN films 24d–24f are formed on aluminum interconnections 25a–25c. A fifth interlayer insulation film 26 is formed on TiN films 24d–24f and on fourth interlayer insulation film 18.

Next with reference to FIGS. 2–6, the manufacturing process of the semiconductor device will be described.

Figure 2:
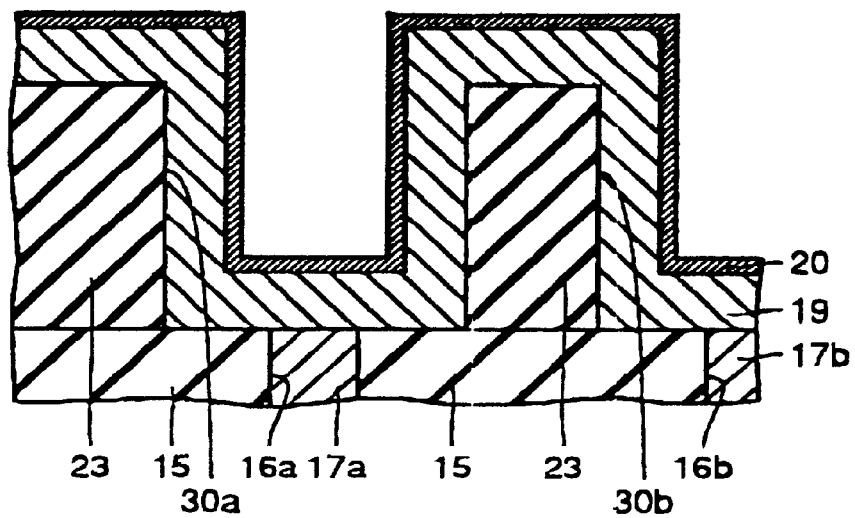
FIGS. 2–6 are partial sectional views showing first to fifth steps of the manufacturing process of the semiconductor device shown in FIG. 1.

As is shown in FIG. 2, trenches 30a and 30b are formed in third interlayer insulation film 23 in regions above plugs 17a and 17b. A polycrystalline silicon film 19 which is to be a capacitor lower electrode is formed in trenches 30a and 30b and on the upper surface of third interlayer insulation film 23. A HSG polycrystalline silicon film 20 is formed on polycrystalline silicon film 19. Here, interconnection 12 (See FIG. 1), field effect transistor and so on located below third interlayer insulation film 23 are formed according to the same manufacturing process as a conventional art.

Figure 3:
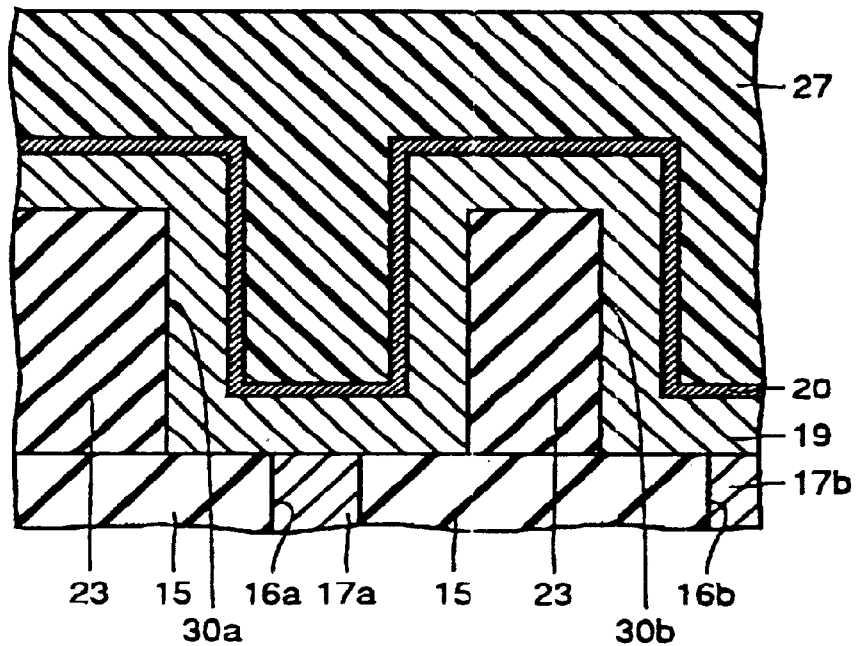

With reference to FIG. 3, a photo resist film 27 is formed on HSG polycrystalline silicon film 20.

Figure 4:
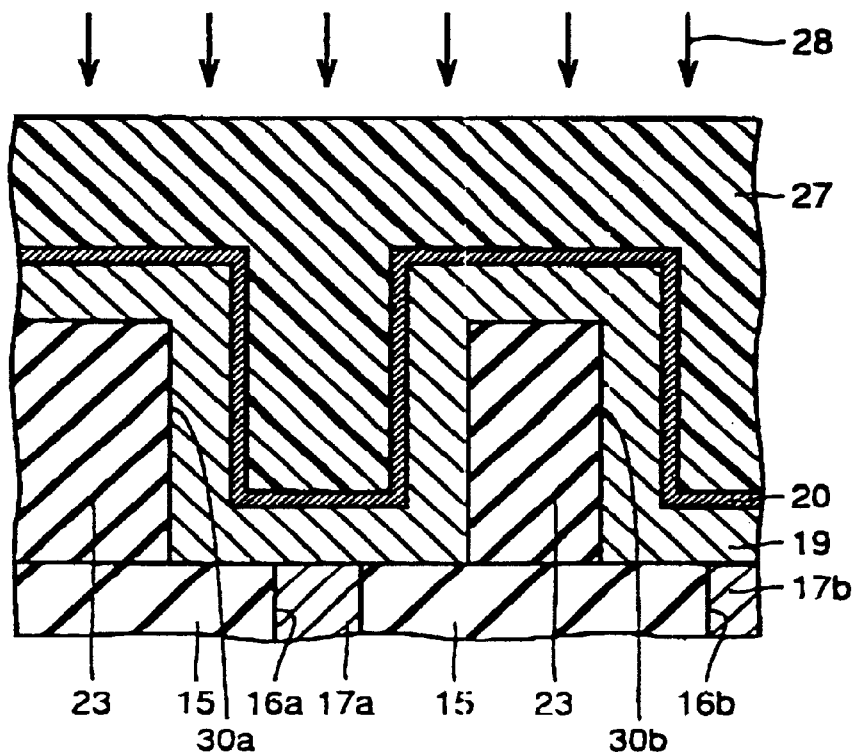

Then as shown in FIG. 4, photo resist film 27 is exposed by a light 28 directed thereon. Here, photoresist film 27 is a positive photo resist film.

Figure 5:
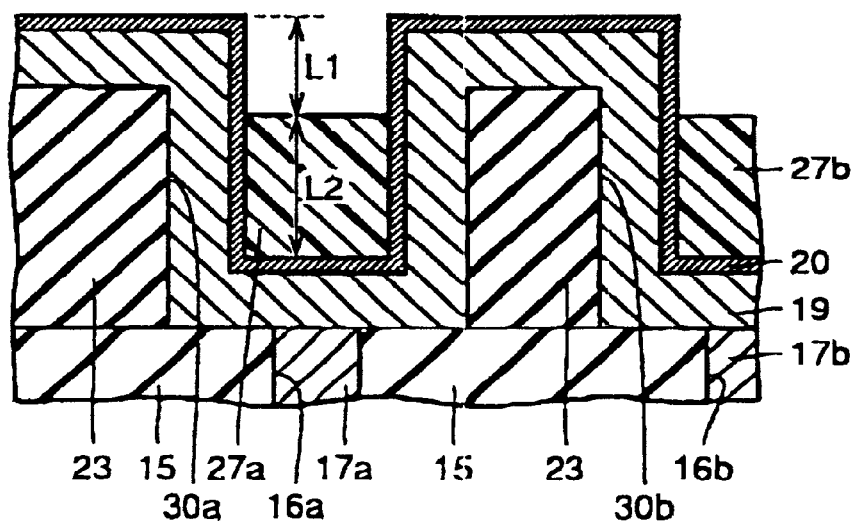

Then by the development of photo resist film 27, portions 27a and 27b of the photo resist film are left in trenches 30a and 30b as shown in FIG. 5 while a portion of photo resist film 27 outside trenches 30a and 30b such as on the upper surface of a third interlayer insulation film 23 is removed (see FIG. 4). Here, recess Length L1 and thickness L2 of portions 27a and 27b of the photo resist film must be controlled with high precision. When recess length L1 is much smaller than a predetermined amount, sometimes polycrystalline silicon film 19 cannot completely be removed from the upper surface of third interlayer insulation film 23 at the removal of polycrystalline silicon film 19 and HSG polycrystalline silicon film 20 on the upper surface of third interlayer insulation film 23. When polycrystalline silicon film 19, for example, is left on the upper surface of third interlayer insulation film 23, failure such as short circuit between capacitor lower electrodes 31a and 31b occurs, causing the operation failure of the semiconductor device. On the other hand when recess length L1 is much too large, capacitor lower electrodes 31a and 31b become small, and predetermined capacity of a capacitor cannot be secured.

Figure 7:
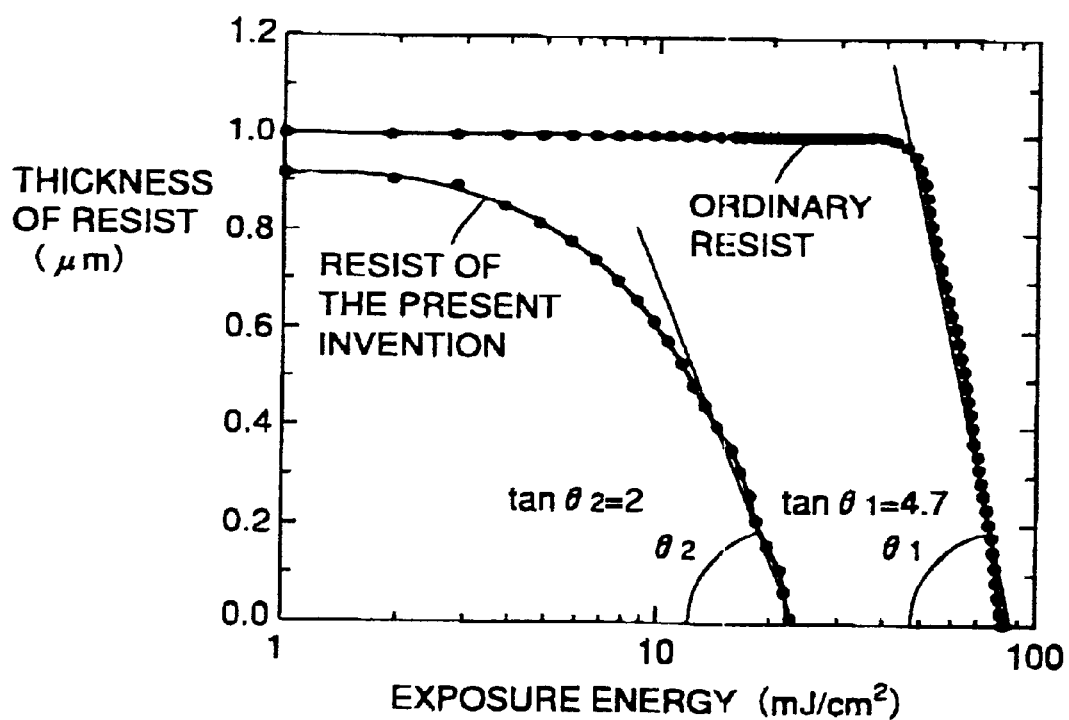
FIG. 7 is a graph showing the relation between exposure energy and thickness of a resist film with respect to a resist used in the manufacturing process of the semiconductor device shown in FIG. 1 and a resist used in an ordinary photolithography.

Therefore, in the manufacturing process of the semiconductor device in accordance with the present invention, a resist has a different characteristic from a resist used for forming ordinary trenches 30a and 30b (see FIG. 5) as shown in FIG. 7.

With reference to FIG. 7, with respect to a resist used in an ordinary photolithography, the thickness of the resist is required to change significantly along with the change in exposure energy. In other words, $\theta_1$ must be as large as possible and normally, tan $\theta_1$=approximately 4.7. On the other hand, the change (magnitude of $\theta_2$) in thickness of the resist which is used for forming capacitor lower electrodes 31a and 31b (see FIG. 1) in accordance with the first example of the present invention along with the change in exposure energy is smaller than that of the ordinary resist. Here, tan $\theta_2$=approximately 2.

By using a resist whose thickness change at the exposure energy change is smaller than that of the ordinary resist, the fluctuation of the film thickness of an exposed portion of the photo resist film 27 (FIG. 4) can be made smaller than the case where the ordinary resist is used, even when the exposure energy of the light used for the exposure fluctuates. As a result the fluctuation of recess length L1 can be made small(see FIG. 5).

Here, the exposure and development are used in the step of leaving portions 27a and 72b of the photo resist film in trenches 30a and 30b. Thus generation of an oxide film possibly caused in the process of conventionally used RIE can be prevented. Therefore in the step of etching polycrystalline silicon film 19 and HSG polycrystalline silicon film 20 on third interlayer insulation film 23, portions of polycrystalline silicon film 19 and HSG polycrystalline silicon film 20 are prevented from being left on upper surface of third interlayer insulation film 23, which has been usually experienced because of the existence of oxide film. As a result, the failure caused by the residual polycrystalline silicon film 19, such as short circuit of capacitor lower electrodes 31a and 31b is prevented, and whereby a highly reliable semiconductor device can be obtained.

In addition, as the recess length L1 is controllable by changing the exposure energy of light 28 (see FIG. 4) used for the exposure, the recess length L1 (and the thickness L2 of left portions 27a and 27b of photo resist film) can be controlled with high precision.

Figure 6:
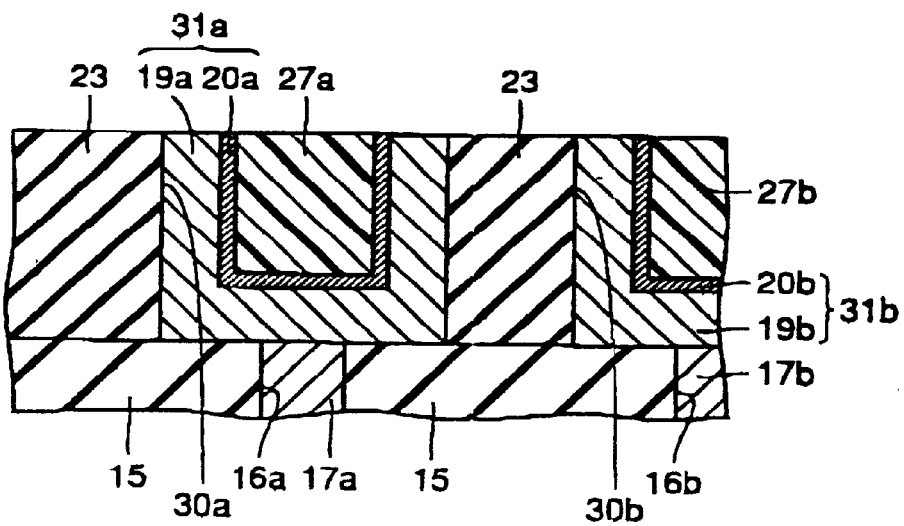

After the step shown in FIG. 5, polycrystalline silicon film 19 and HSG polycrystalline silicon film 20 on the upper surface of third interlayer insulation film 23 are etched with photo resist films 27a and 27b used as masks. Thus the structure shown in FIG. 6 is obtained.

Subsequently, with the removal of photo resist films 27a and 27b and the formation of dielectric film 21 (see FIG. 1), upper electrode 22 (see FIG. 1) and so on, the semiconductor device shown in FIG. 1 can be obtained.

Though herein the manufacturing process in accordance with the first example of the present invention is used for forming capacitor lower electrodes 31a and 31b, the process can be used for forming other structure of a semiconductor device such as a demascene interconnection with the same advantage. Though in this example, polycrystalline silicon film 19 and HSG polycrystalline silicon film 20 are formed under the photo resist film (see FIG. 3), a conducting material film other than a polycrystalline silicon film, such as a film including at least one selected from the group consisting of silver, aluminum, copper or an alloy thereof, or molybdenum, nickel, palladium, platinum, rhodium, tantalum, titanium and tungsten, or silicide and nitride thereof.

Figure 8:
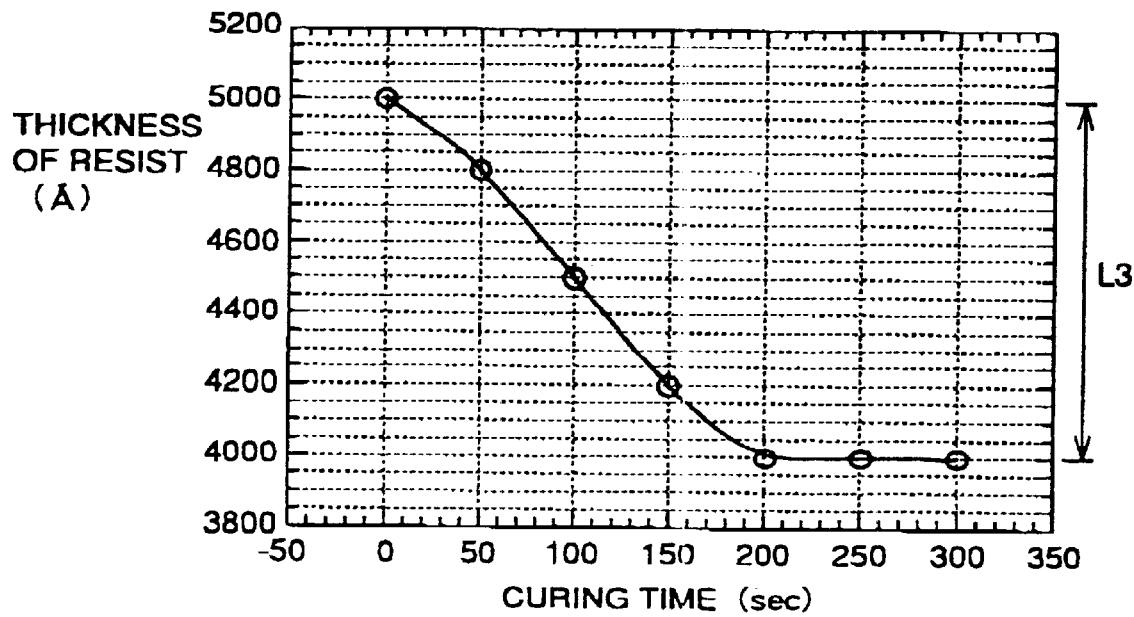
FIG. 8 is a graph showing the relation between curing time and thickness of a resist used in a modification variation of the first example of the manufacturing process of the semiconductor device in accordance with the present invention.

In the first example of the present invention, the exposure/development is used for leaving portions 27a and 27b of photo resist film in trenches 30a and 30b. Curing (irradiation of ultra violet rays and heat treatment) can also be used instead of the exposure/development. With reference to FIG. 8, the photo resist film shrinks upon being cured. The shrinkage of the resist proceeds and the thickness decreases along with the curing. When the curing time exceeds a certain amount of time, the shrinkage of the resist stops at a certain value. Therefore, with the initial thickness of photo resist film 27 being set from the thickness L2 (see FIG. 5) of photo resist films 27a and 27b left in trenches 30a and 30b and the amount of shrinkage L3 of the photo resist film, a predetermined recess length L1 can be achieved by curing. In addition, as the fluctuation of shrinkage of the photo resist film at the curing is smaller than the fluctuation of recess length in a conventional RIE, for example, a desired recess length L1 can be obtained with higher precision.

Second Example

The second example of the manufacturing process of the semiconductor device according to the present invention essentially includes the same steps as the first example of the present invention shown in FIGS. 2–6. In the second example, however, a resist film without photosensitive agent, such as a resist consisting of novolac resin alone, is used in the place of a positive photo resist film. A negative photo resist film may also be used. By performing the development without the exposure and controlling the time for development, the resist films 27a and 27b are left in trenches 30a and 30b (see FIG. 5) and the recess length L1 is controlled.

Unlike the conventional art, as RIE is not performed in the step of leaving resist films 27a and 27b in trenches 30a and 30b, the same advantage as in the first example of the present invention can be obtained.

In addition, as the recess length L1 is controlled by adjusting the time of development and not by controlling the exposure energy, the fluctuation of the exposure energy requires no consideration, whereby the control of recess length L1 with a higher precision is allowed.

Third Example

The third example of the manufacturing process of the semiconductor device in accordance with the present invention essentially includes the same steps as the manufacturing process of the semiconductor device in accordance with the first example of the present invention shown in FIGS. 2–6. In a photo resist film used in the third example, the resist film of thickness L4 is left even when the exposure energy exceeds a certain value, as shown in FIG. 9.

Figure 9:
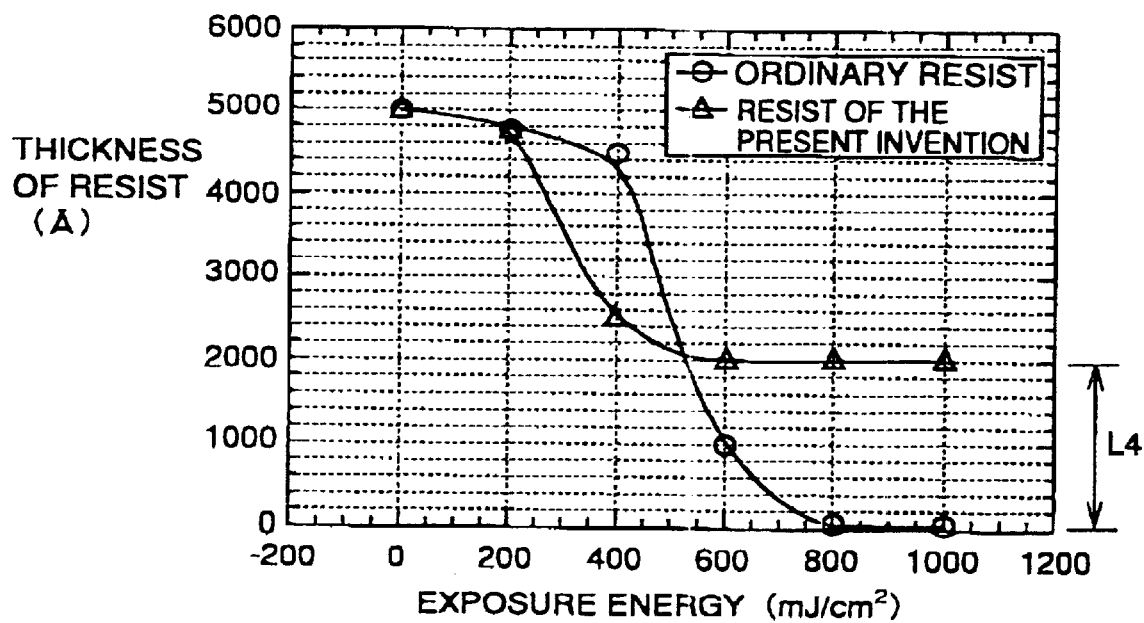
FIG. 9 is a graph showing the relation between exposure energy and thickness of a resist with respect to a resist used in a third example of the manufacturing process of the semiconductor device in accordance with the present invention and a resist used in an ordinary photolithography.

With reference to FIG. 9, in a resist employed in an ordinary photo lithography, the thickness of the left resist attains approximately 0 along with the increase in the exposure energy. In the third example of the present invention, however, photo resist films 27a and 27b that are used for forming capacitor lower electrodes 31a and 31b (see FIG. 6) have a characteristic wherein a photo resist film of a certain thickness L4 is left regardless of the increase in the exposure energy, as shown in FIG. 9. Therefore, by adjusting the composition of photo resist film 27 (see FIG. 3), such that the thickness L4 of the left photo resist film at the large exposure energy matches the thickness L2 of photo resist films 27a and 27b (see FIG. 5) left in trenches 30a and 30b, photo resist films 27a and 27b with a stable thickness can be obtained regardless of the fluctuation of the exposure energy, which occurs when the exposure energy exceeds a certain amount, of the light used for the exposure. This enables the highly precise control of the recess length L1.

In addition, by adjusting the chemical composition of photo resist film 27, the thickness L4 of the photo resist films 27a and 27b which is left even at the large exposure energy can be controlled. Thus, the adjustment of chemical composition of photo resist film 27 allows the control of thickness L2 of photo resist films 27a and 27b left in trenches 30a and 30b, and whereby the control of recess length L1 is allowed.

Here, as to the composition of photo resist film 27, compound of novolac resin and chemical substances as a photosensitive agent including photosensitive group such as hydroxybenzophenon or 1,2-naphthoquinonediazidosulfonyl (1,2-naphthoquinone diazido sulfonyl) group can be used.

Fourth Example

Figure 10:
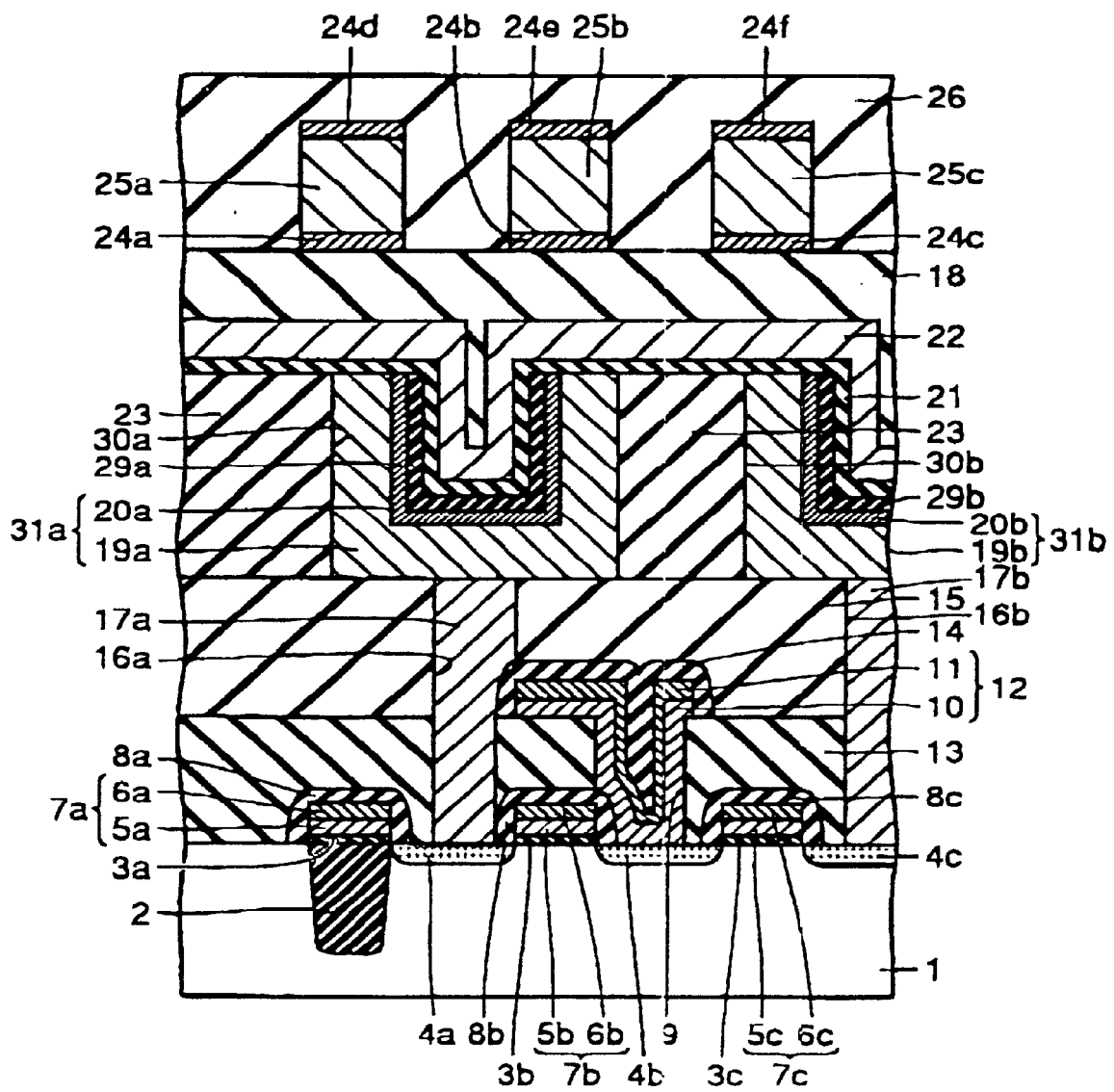
FIG. 10 is a sectional view showing a fourth example of the semiconductor device according to the present invention.

Referring to FIG. 10, the semiconductor device is essentially provided with the same structure as the first example shown in FIG. 1. In the semiconductor device shown in FIG. 10, however, light absorption films 29a and 29b are formed on HSG polycrystalline silicon films 20a and 20b, for absorbing the light used for the exposure at the formation of capacitor lower electrodes 31a and 31b.

At the step of exposure for forming photo resist films 27a and 27b (see FIG. 14) used as masks in trenches 30a and 30b in the manufacturing process described hereinafter, the light used for the exposure is absorbed by light absorption films 29a and 29b. Thus the light is prevented from reaching insulation film 14, interconnection 12 and so on below light absorption films 29a and 29b. Thus the light used for exposure is not reflected irregularly by the lower structure such as interconnection 12, and the side surfaces or the bottom surfaces of photo resist films 27a and 27b in trenches 30a and 30b are not irradiated with the light. Therefore, partial exposure and removal of photo resist films 27a and 27b which should be left in trenches 30a and 30b can be prevented. Thus photo resist films 27a and 27b can surely be left in trenches 30a and 30b.

With reference to FIGS. 11–14, the manufacturing process of the semiconductor device will be described. FIGS. 11–14 correspond to FIGS. 2–5 showing the manufacturing process of the semiconductor device in accordance with the first example of the present invention.

Figure 11:
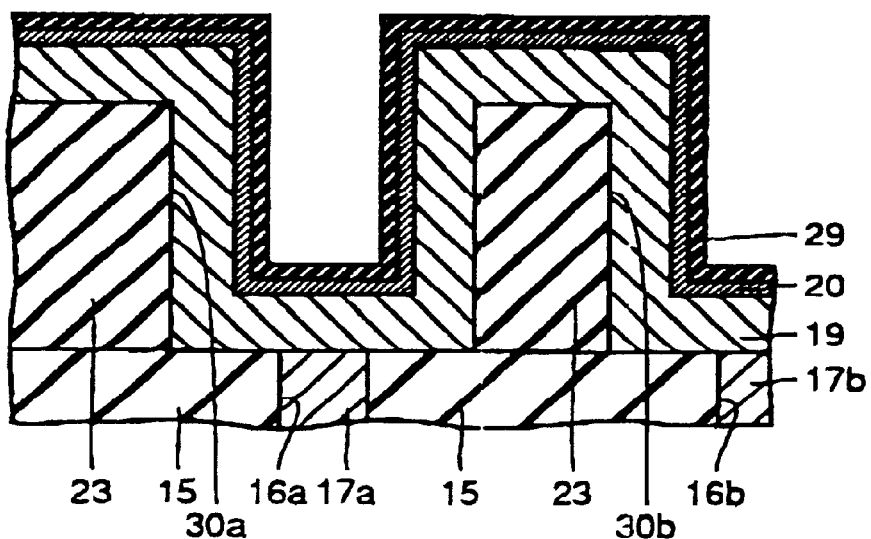
FIGS. 11–14 are partial sectional views showing first to fourth steps of the manufacturing process of the semiconductor device shown in FIG. 10.

First, after the same step as the manufacturing process of the semiconductor device shown in FIG. 2, light absorption film 29 of silicon nitrided oxide film is formed on HSG polycrystalline silicon film 20. Thus the structure shown in FIG. 11 is obtained.

Figure 12:
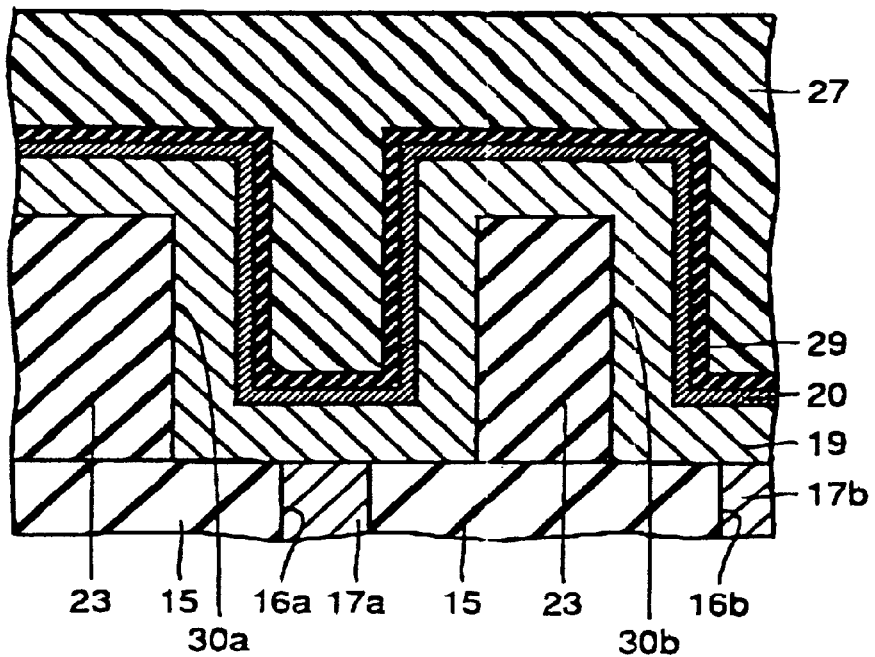

Next as shown in FIG. 12, photo resist film 27 is formed on light absorption film 29. Photo resist film 27 is a positive photo resist film as in the first example.

Figure 13:
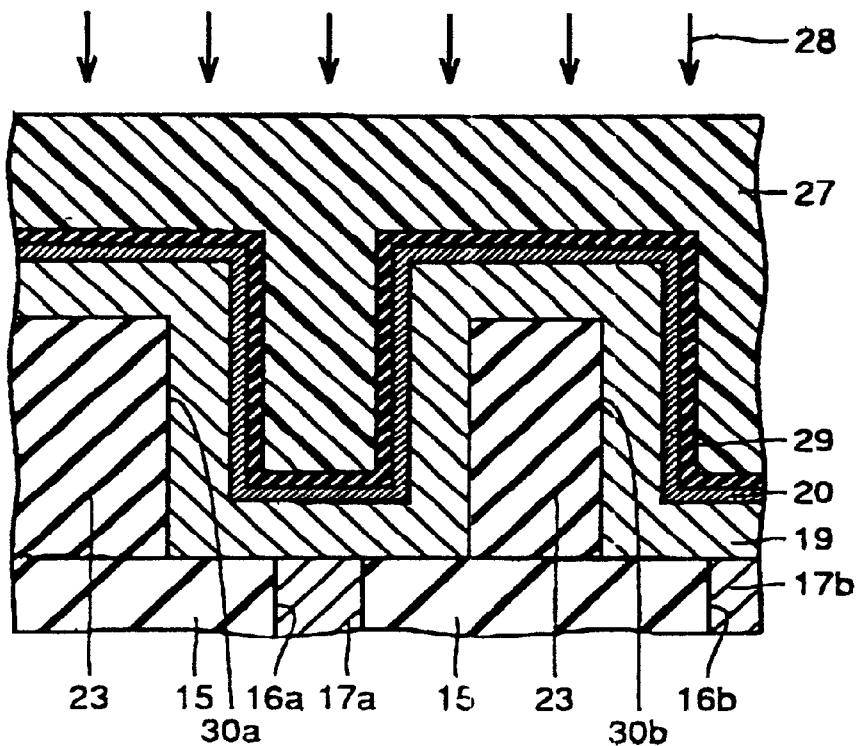

Then, by irradiating photo resist film 27 with light 28, as shown in FIG. 13, photo resist film 27 is exposed in the region outside portions 27a and 27b (see FIG. 14) which are to be left in trenches 30a and 30b. Because of the existence of light absorption film 29, light 28 used for the exposure can be prevented from reaching third interlayer insulation film 23 or polycrystalline silicon film 19 below light absorption film 29. Thus the light reaching third interlayer insulation film 23 and so on is prevented from being reflected irregularly. Therefore, the light is prevented from reaching photo resist film 27 which should be left in trenches 30a and 30b without being exposed.

Figure 14:
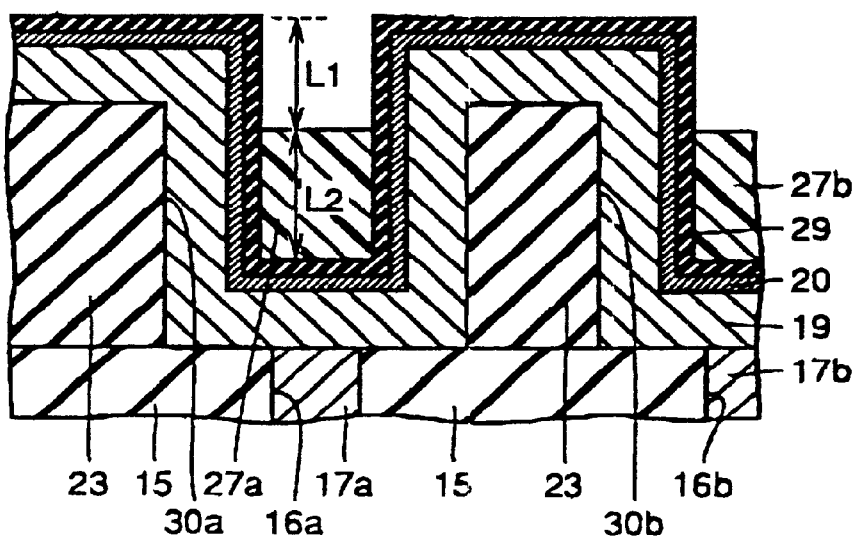

Then by the development of photo resist film 27, photo resist films 27a and 27b are left in trenches 30a and 30b while photo resist film 27 is removed in the region outside trenches 30a and 30b as shown in FIG. 14. Here, the recess length L1 is controlled by adjusting the exposure energy of light 28 used for the exposure as in the first example.

The semiconductor device shown in FIG. 10 can be obtained through the same steps as in the manufacturing process of the semiconductor device according to the first example shown in FIG. 6.

Fifth Example

Figure 15:
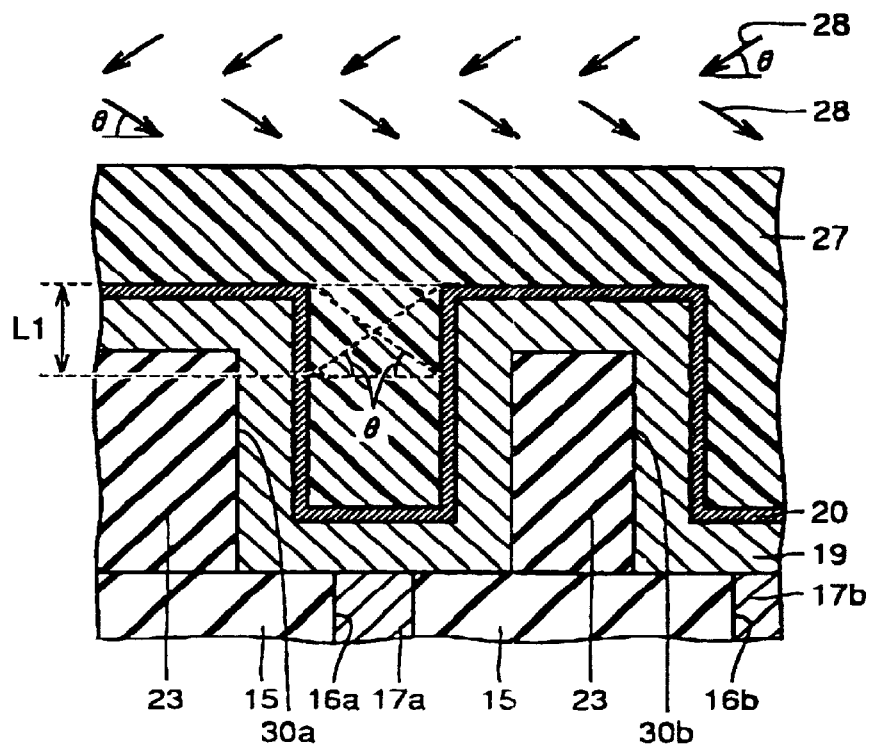
FIG. 15 is a partial sectional view referenced for describing a fifth example of the manufacturing process of the semiconductor device in accordance with the present invention.

The manufacturing process shown in FIG. 15 essentially corresponds to the manufacturing process of the semiconductor device shown in FIG. 4 in accordance with the first example of the present invention. In the fifth example, however, light 28 for the exposure of photo resist film 27 is directed obliquely so as to form an angle of inclination θ on the upper surface of third interlayer insulation film 23 as shown in FIG. 15.

Being directed obliquely, light 28 for the exposure is prevented from reaching photo resist film 27 located at the bottom portion in trenches 30a and 30b, unlike a conventional case where light 28 enters vertically. Thus the photo resist film 27 at the bottom portion in trenches 30a and 30b is prevented from being exposed. Hence, photo resist films 27a and 27b (see FIG. 5) can surely be left in trenches 30a and 30b.

In addition, by adjusting the angle of inclination θ of light 28, it is possible to control light 28 so that it does not reach the portion below the upper surface of photo resist films 27a and 27b left in trenches 30a and 30b. As a result, the light is surely prevented from reaching the portions 27a and 27b of photo resist film 27, which are to be left. In addition, by the adjustment of the angle of inclination θ of light 28, recess length L1 can be controlled.

As the recess length L1 is controlled by the adjustment of angle of inclination θ of light 28, the precision of recess length L1 can be enhanced without the need of consideration of the fluctuation of the energy of light 28.

Through the same steps as the manufacturing process of the semiconductor device in accordance with the first example of the present invention shown in FIGS. 5 and 6, the semiconductor device shown in FIG. 1 is obtained.

Figure 16:
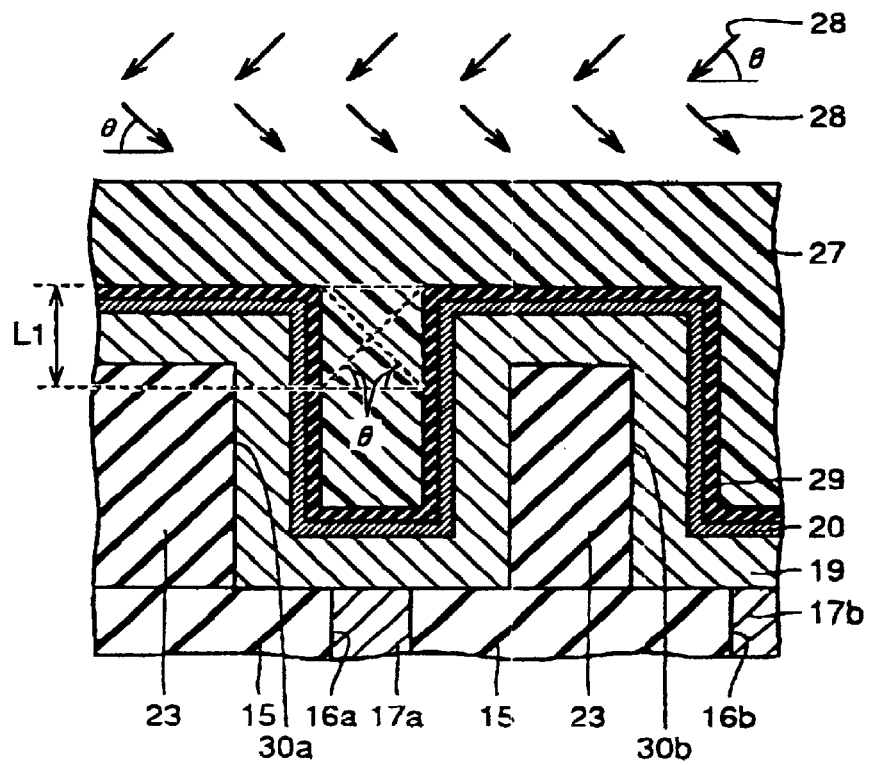
FIG. 16 is a partial sectional view referenced for describing a variation of the fifth example of the manufacturing process of the semiconductor device in accordance with the present invention.
Figure 17:
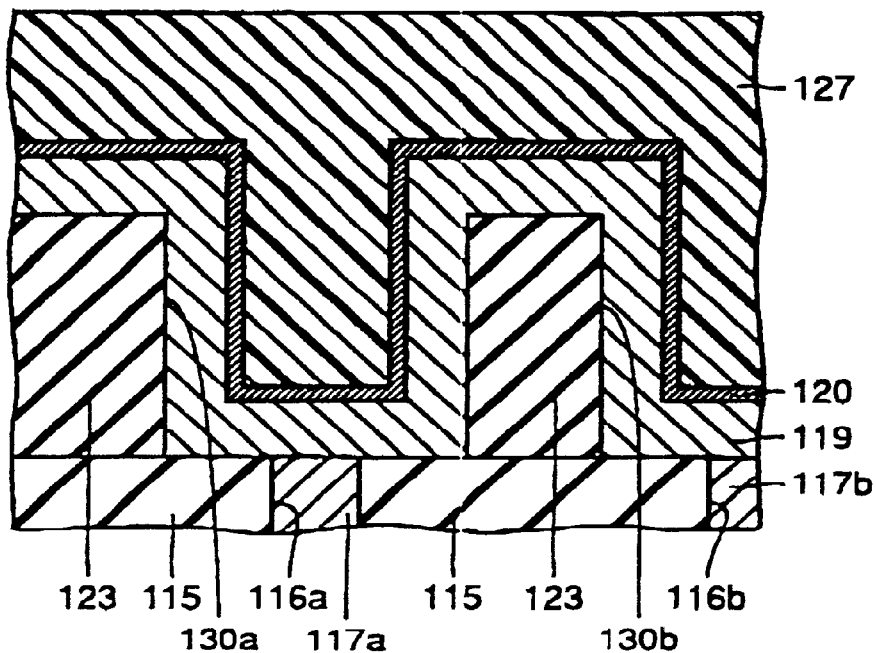
FIGS. 17–19 are partial sectional views showing first to third steps of a manufacturing process of a semiconductor device on which the present invention is based.
Figure 18:
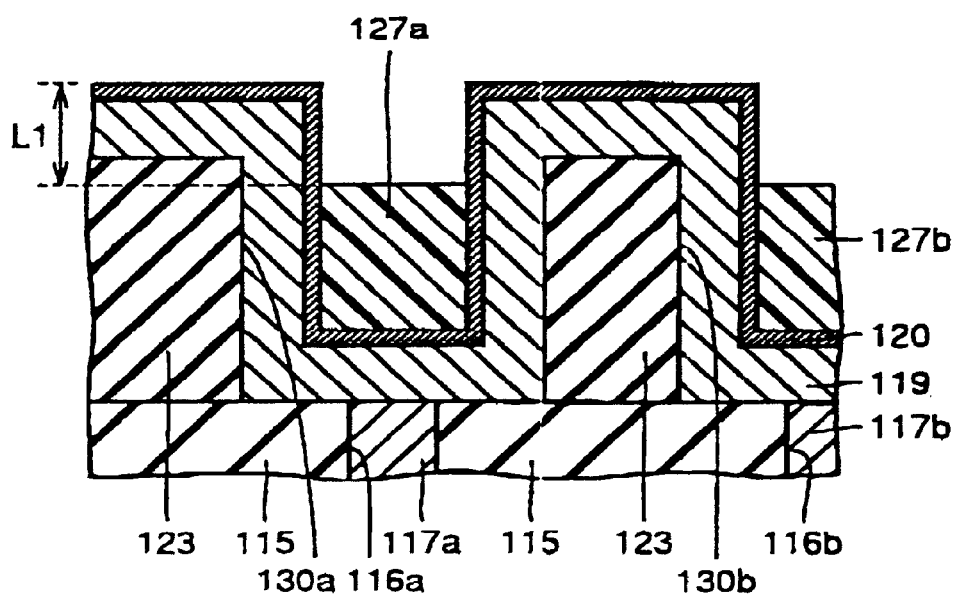
Figure 19:
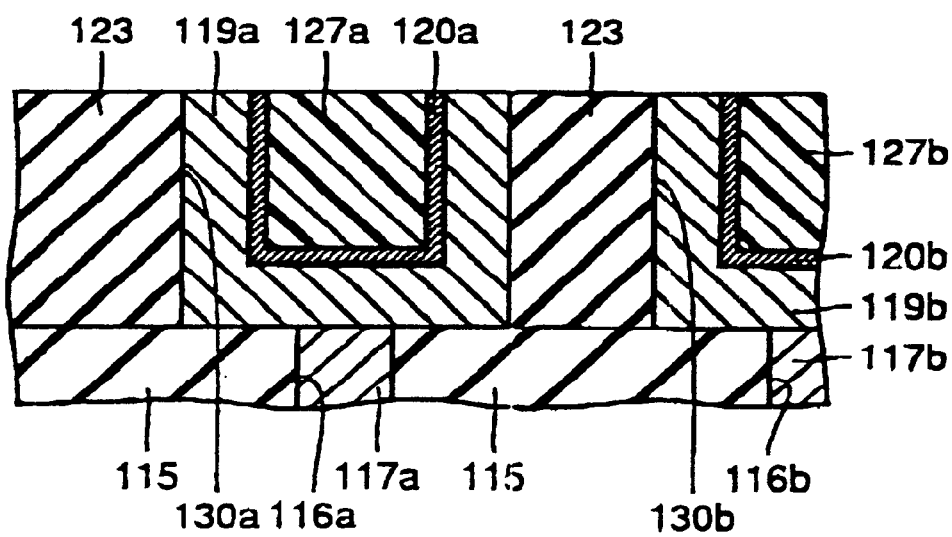

With reference to FIG. 16, a variation of the manufacturing process of the semiconductor device in accordance with the fifth example of the present invention is essentially the same with the manufacturing process of the semiconductor device shown in FIG. 15 except that light absorption film 29 is formed on HSG polycrystalline silicon film 20.

Because of the existence of light absorption film 29, light 28 can be prevented from being transmitted through polycrystalline silicon film 19 or the like. Thus light 28 is not transmitted through polycrystalline silicon film 19 or the like and is not reflected irregularly, and whereby light 28 can be prevented from reaching photo resist film 27 at the bottom portion in trenches 30a and 30b. As a result, photo resist films 27a and 27b (see FIG. 14) are surely left in trenches 30a and 30b.

The semiconductor device as shown in FIG. 10 can be obtained by performing the manufacturing steps of the semiconductor device in accordance with the fourth example of the present invention shown in FIG. 14 after the manufacturing step shown in FIG. 16.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a stacked capacitor formed inside a trench, said stacked capacitor including from bottom to top
a capacitor lower electrode,
a light absorption film on and above at least a portion of said capacitor lower electrode,
a capacitor dielectric film on said light absorption film, and
a capacitor upper electrode on the capacitor dielectric film.

* * * * *